United States Patent [19]
Glass et al.

[11] 3,975,632
[45] Aug. 17, 1976

[54] PHOTOVOLTAIC GENERATION AND DEVICE

[75] Inventors: Alastair Malcolm Glass, Millington; Dietrich von der Linde, North Plainfield, both of N.J.

[73] Assignee: Bell Telephone Laboratories, Incorporated, Murray Hill, N.J.

[22] Filed: Aug. 11, 1975

[21] Appl. No.: 603,349

[52] U.S. Cl. .................................. 250/212; 357/30; 136/89
[51] Int. Cl.² ........................................ H01J 39/12
[58] Field of Search .......... 250/211 R, 212; 357/30, 357/29; 136/89; 252/501

[56] References Cited
UNITED STATES PATENTS
3,899,428  8/1975  Auston et al. .................... 350/30 X OTHER PUBLICATIONS
Lempicki: Physical Review; vol. 113; No. 5, 3/1/59; pp. 1204–1209.

*Primary Examiner*—Walter Stolwein
*Attorney, Agent, or Firm*—G. S. Indig

[57] ABSTRACT

Photovoltaic generation of voltages well above the bandgap results upon absorption of radiation by a dipolar dopant within a transparent polarized pyroelectric body. Generation is by a charge transfer mechanism in accordance with which electrons are transferred from excited absorbing species. A photovoltage of greater than a thousand volts has been observed in $Fe^{2+}$-doped $LiNbO_3$.

12 Claims, 1 Drawing Figure

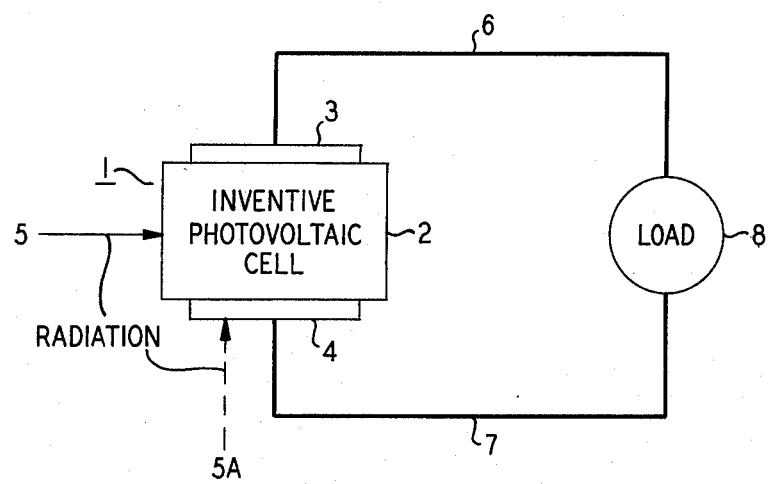

3,975,632

PHOTOVOLTAIC GENERATION AND DEVICE

BACKGROUND OF THE INVENTION

1. Field of the Invention

The invention is concerned with photovoltaic generation.

2. Description of the Prior Art

Photovoltaic devices have been available in a variety of commercial forms for some years. Commercially available devices have invariably depended upon a junction effect--that is, upon the junction field separation of photo-generated electron-hole pairs; and as a consequence, maximum generated voltages are, in magnitude, equal to the bandgap of the material. One such class of devices is exemplified by the selenium cell which has, for many years, been used as a photographic light meter. Voltages in the selenium cell are generated at the selenium-metal interface defined at one electrode.

A development which grew out of the emphasis on semiconductor technology stimulated by the transistor takes the form of the silicon solar cell. Here, a planar junction between $p$ and $n$ regions serves to divide the carrier pairs again generated within carrier lifetime distance of the junction by light absorbed in a thin outer region, and the voltage generated is equal to the approximate 1.1 volt silicon bandgap. Junction devices of this nature are described in 25, *Journal of Applied Physics*, page 676 (1954).

A second type of photovoltage, also limited to bandgap value may occur in the absence of a junction. The responsible effect, the "Dember effect" depends on an absorption gradient in a uniform medium. See 109, *Journal of the Electrochemical Society*, page 688 (1962). An analogous effect depends on a composition gradient--see 29, *Reviews of Modern Physics*, page 308 (1957).

Anamolously high photovoltages have been observed. The best known example concerns zinc sulfide, and a number of technical papers reporting voltages well above the bandgap have appeared. See, for example:

102, Physical Review, No. 3, page 705 et seq. May (1956);
109, Physical Review, page 1860 (1958),
109, Physical Review, page 601 (1958),
113, Physical Review, page 1204 (1959), and
40, Journal of Applied Physics, page 66 (January 1969). Workers have considered these anamolous effects mystifying and have attributed them to a variety of mechanisms. For example, in zinc sulfide, the effect has been attributed to junctions resulting from the stacking faults. These crystalline faults, generally lamalar in form, define interfaces between successive Wurtzite and cubic forms which coexist at room temperature.

SUMMARY OF THE INVENTION

A mechanism which may give rise to very high photovoltages is described. This mechanism, typically responsive to radiation within the wavelength range of from 5 microns to 0.1 microns, upon which the devices of the invention are based, relies on a bulk effect in accordance with which electronic transfer results from excited dipoles associated with light absorbing centers. The original impetus and the origin of the only net directionality of such electrons is the result of dipole orientation. Such dipoles associated with dopants--preferably absorbing in the visible--are dispersed as solute within poled spontaneously polarized material. This material, which may be single crystal or polycrystalline, is necessarily within the class which permits the well-known pyroelectric response. It is well known that all such materials also permit ferroelectricity. The inventive requirement, however, does not include the switching and hysteresis properties of ferroelectric--it being required only that there be a net polarization sufficient to result in alignment of the dipolar dopant.

A recently developed class of devices is dependent upon the emission resulting from excitation of absorbing dipolar species in a polarized environment. See 5, *Optics Communication*, page 45 (1972). The only condition that need be superimposed upon materials suitable for such use is that of charge transfer. This requirement is conveniently described in terms of the necessary photoconductivity characterized by the dopant species in the pure form.

The additional inventive requirement is for appropriate electrodes defining extreme surfaces in the net polar direction.

BRIEF DESCRIPTION OF THE DRAWING

The FIGURE is a schematic representation of apparatus suitable for the practice of the invention.

DETAILED DESCRIPTION

1. The FIGURE

The FIGURE depicts a body 2 consisting of a polarized host exhibiting a net moment having a component in the direction defined by electrodes 3 and 4. The host of body 2 is transparent to radiation depicted as arrow 5 but is doped with color centers which absorb radiation within the visible spectrum. Arrow 5A shown in phantom represents an alternative species in which light is introduced through a transparent electrode 4. Devices using this arrangement are common and electrode materials exhibiting appropriate transparency are exemplified, for example, by tin oxide, thin deposited gold, indium oxide, etc. These color centers have a ground state dipolar moment, as described, and, upon absorption, result in charge transfer to produce the photocurrent which is the essence of the invention. Photocurrent flows via conductors 6 and 7 through load 8 to complete the electrical circuit. Load 8 may be any form of electrical device, desirably impedance-matched to photovoltaic cell 1.

2. Material Requirements

The essential requirement of the invention is a color center or "absorbing species". This center absorbs radiation, preferably within the visible spectrum, to liberate electrons by a charge transfer mechanism. The center is characterized by a ground state dipole moment of at least 0.01 Debye. The required charge transfer mechanism is satisfied in any such center which in the pure form evidences photoconductivity. Photoconductivity, a measure of electron liberation upon absorption of light, that is, of the transfer of electrons to the conduction band, or, in the instance of holes, to the valence band, is sufficient if the light conductivity in a uniform body of material consisting of the color centers is at least $10^{-14}$ $(\text{ohm-cm})^{-1}(\text{Wcm}^{-2})^{-1}$.

The concentration of this dopant material generally lies within the range of from 0.005 to 5 atom percent.

A number of factors are considered in determining this range; and, depending upon these factors, a preference exists for one or a different portion. A first consideration has to do with absorption of the concerned radiation. As in transducers of this general nature, it is desired that conversion essentially be high. For any given system, concentration should be sufficiently high that concerned radiation is absorbed at a level such that no more than about $1/e$th is transmitted, where $e$ is the natural logarithm base. This distance is conventionally known as the "absorption length". It may be stated in usual terminology that the concentration must be such that the thickness of the body in a relevant radiation direction be at least one absorption length. As an example, $Fe^{2+}$ at a concentration of 0.1 atom percent gives rise to an absorption length of 0.025 cm in a transparent host. The same requirement may give rise to a concentration as high as 5 atom percent for the same dopant or absorbing species for a body which is 5 microns thick. In general, a minimum dimension of the body corresponding to greater than about 3 absorption lengths gives little further advantage.

A completely engineered device, in accordance with the invention, must take account of the mean-free path of the electron which is propelled from the excited dipole. The requirement that this dopant be photoconductive inherently requires an average mean-free path sufficient to avoid recapture by the very center of electron origin. To usefully contribute to the photovoltaic effect, the liberated electron should be captured by a second color center. Once propelled, the electron moves in the field direction prescribed by the polarization of the host. This useful directional traversal ordinarily continues until a first collision. The effect of the first collision, generally with a lattic phonon (a vibrational quantum), is to randomize direction of travel. The entire effective energy conversion upon which the invention is based is, therefore, a consequence of this first travel period before collision. In an optimum case, it would be desirable to have a sufficiently long mean-free path, such that essentially all of the initially propelled electrons travel without collision to a trapping center. This trapping center should be a second color center which can, through the mechanism of dipolar excitation and charge transfer, in turn, liberate an electron upon absorption of a quantum of radiation energy. In a preferred embodiment, a concentration of color centers should be sufficient to result in an average spacing equal to the electronic mean-free path. For many systems, however, other considerations noted result in far greater spacing. As an illustration, Example 1, utilizing a material consisting of 0.1 atom percent $Fe^{2+}$ in $LiNbO_3$ is found to owe its effectiveness to a net mean-free path of only about 1 Angstrom unit. The conclusion is reached that the spacing of centers in this example was perhaps 10 times this total mean-free path. Under many systems, that is, in applications in which high current flow is not required, lesser concentrations may be adequate. A concentration sufficiently small as to be equivalent to a spacing of 100 times the total mean-free path may, in a material of sufficiently low conductivity, result in attainment of open circuit voltages of a thousand volts/cm or greater in periods of one second for a light intensity of 1 w/cm² for typical structures.

The host material is, under most circumstances, desirably transparent to the radiation of concern. For preferred devices in accordance with the invention in which dependence is had upon a wavelength within the visible spectrum, that is, from 7,000 to 4,000 Angstrom units, the host should exhibit an absorption in the relevant spectral range of no greater than ten percent for the radiation transmission direction.

Since the inventive phenomenon depends upon charge accumulation or, at the very least, upon net directional flow, there is the expected requirement that resistivity be sufficiently high under operating conditions to permit this fundamental mechanism. In broad terms, resistivity must be at just such a minimum level---i.e., sufficient to permit charge accumulation due to charge transfer from excited dipole liberation. In terms of the design parameters set forth above, a dark resistivity of at least $10^6$ ohm-cm is generally adequate. A preferable minimum is $10^{12}$ ohm-cm. While this parameter is described in terms of the host material, the dopant may also contribute so that the resistivity minimum states is that for the entire body.

In general, the device function is dependent only upon the dopant-host combination described. The phenomenon of electronic or upper band edge absorption is, however, well known; and the possibility of modifying composition to better take advantage of particular available radiation may exist. So inclusion of other dopant material to effect energy transfer--e.g., a dopant to provide a first photon absorption for a multiple photon event--may be provided where available radiation peaks at a wavelength below that of the upper absorption edge of the dopant species.

In the preferred embodiment, polarization of the host is perfect, both as to direction (defining the shortest distance between electrodes) and quantity (all host dipoles contributing). While this condition is generally attainable in a perfect single crystal and nearly attainable in relatively dislocation-free polycrystals, it may not be attainable in materials otherwise satisfactorily applied. The minimum requirement is for a net polarization in the electrode direction. Device efficiency may be considered primarily in terms of the potential energy distortion at the dopant site and other considerations which together affect the net electronic mean-free path. The primary effect of the host remanent polarization is to impart directionality and thereby increase this most significant parameter. The most significant device requirement with regard to the host polarization is simply that there be sufficient remanence to maintain the body in the saturated condition.

While discussion has been in terms of crystalline material--the class traditionally associated with electrical polarization effect and, undoubtedly, the preferred class for the purposes of the invention--another class of material may be utilized. A class of organic material, exemplified by polyvinylidene fluoride and polyvinyl fluoride, has been reported as exhibiting the remanent polarization required for the purposes of the invention. Such a material may be utilized as the host for a color species having the required solubility.

Other material considerations are not directly relevant to the operative mechanism. These are the usual requirements of chemical and physical stability under the operating conditions. So, for example, the soluble pyroelectric, such as, poled ADP, may serve a long-term device use only if encapsulated or otherwise protected from any moisture-containing ambient.

3. Device Design

General requirements have been set forth in the preceding section. Such requirements--e.g., device thickness--are dependent upon such factors as color center concentration, absorption efficiency, etc. Other considerations are concerned with desired photovoltage, as well as photocurrent, expected or available radiation intensity, etc. Still other design considerations are conventional (e.g., impedance matching). Electrode design should be such as to minimize contact resistance. Where design is such that electrode transparency is desired, electrode material, such as, indium oxide and tin oxide, may be utilized for radiation wavelengths within the visible spectrum. In general, electrode area should at least approach the total area of the relevant body surface for charge accumulation. This desideratum arises from the expectation of high current.

As in other primary generators, highest utilization efficiency coincides with a condition of impedance matching. In general, devices of the invention are characterized by high impedance values--e.g., $10^6$ ohm or greater. Effective utilization, therefore, generally requires similarly high impedance loads. It is comtemplated that these devices will be most valuably used for biasing high voltage, low current drain apparatus.

4. The Example

A single crystal of $LiNbO_3$ containing 0.1 atom percent $Fe^{2+}$ was prepared by Czochralski pulling from a melt containing 0.1 weight percent $Fe_2O_3$ and 99.9 weight percent $LiNbO_3$ in accordance with the procedure described in 27, *Journal of Physics and Chemistry of Solids*, page 983 (1966). The grown crystal evidenced an absorption coefficient of 38 $cm^{-1}$ (an absorption length of 0.025) and a dark resistivity of $10^{14}$ ohm-cm. A crystalline body of dimensions 1 cm by 1 cm by 0.0225 cm was cut and polished and electrodes of thin gold were affixed to the broad faces by evaporation. Wire leads were run to an electrooptic modulator of a characteristic impedance of approximately $10^{15}$ ohms which was greater than that of the body. Electrodes, therefore, defined a thickness of crystalline material of approximately 0.025 cm which had been poled in that direction. The body was then irradiated with 5145 Angstrom units wavelength unmodulated radiation from an argon-ion laser with a peak intensity approximately 1 $w/cm^2$. Photovoltages as determined from the modulator transmission attained a value of well in excess of 1,000 volts ($>10^5$ volts/cm) in a period of one second. Continuous radiation of the value noted resulted in a substantially unvarying dc voltage of the stated value for an instant radiation period of ½ hour.

Many experiments showing similar results were conducted using a variety of materials, operational parameters, and apparatus arrangements. Such varying parameters and other conditions resulted in essentially dc voltages, i.e., from about 1 Hz to 0 Hz. Depending on conditions, photovoltages were over a broad range up to a maximum of about 10,000 volts which for the conditions of the latter experiment was the maximum available due to dielectric breakdown of the surrounding air. That the effect was steady state (as distinguished from the transitory effect associated with pyroelectricity) was established by a continuance of essentially constant photovoltages at such levels for periods of up to about a day. Such experiments established the concept of a saturating voltage which occurs, since at high radiation intensities the photocurrent divided by the photoresistance is independent of intensity.

The conclusion is reached that the inventive matter, in its most important aspects, is concerned with steady state conditions--i.e., dc or near dc. Photovoltages of photocurrents to be detected generally represent saturation values which for incident radiation intensities even as high as 1 $w/cm^2$ imply time constants of the order of a second. In general, therefore, devices operated in accordance with the described phenomenon contemplate incident radiation also of an essentially dc character as described above.

What is claimed is:

1. Photovoltaic device for operation in the visible and near visible spectrum comprising a body of photovoltaic material together with electrodes for drawing current from the said body, said body evidencing remanent electrical polarization in such direction as to result in a component in the direction defined by the said electrodes, characterized in that said body consists essentially of a pyroelectric host material and a solute material, the said solute having an upper absorption edge within the wavelength range of from 5μm to 0.1μm and being present at sufficient concentration to result in an absorption length at a wavelength of electromagnetic radiation in the said range of a maximum equal to a dimension of the said body, the said solute evidencing a dipole moment of at least 0.01 Debye in its ground state, the said solute having a light conductivity of at least $10^{-14}$ $(ohm-cm)^{-1}$ $(Wcm^{-2})^{-1}$, the said host in its undoped condition having an absorption length most equal to that of the host solute material for the said wavelength, whereby the said solute is electrically aligned by the said host, the said solute, upon absorbing a quantum of energy, releases a charge carrier which moves under the influence of the polarization of the host, which in turn makes a contribution to an overall net electronic flow, whereby charge accumulation results at the electrodes-body interfaces.

2. Device of claim 1 in which the said body is a single crystal.

3. Device of claim 1 in which the total absorption in an incident radiation direction is at least $1/e$.

4. Device of claim 3 in which an incident direction is approximately that direction defining the shortest distance between electrodes.

5. Device of claim 4 in which radiation is made incident upon one of the said electrodes and in which the said one electrode has an absorption for the said radiation no greater than a maximum absorption of 25 percent.

6. Device of claim 5 in which the other said electrode is at least partially reflecting for the said radiation.

7. Device of claim 6 in which the said other electrode is essentially totally reflecting for the said radiation.

8. Device of claim 1 in which the said host material has an electrical resistivity of at least $10^6$ ohm-centimeters.

9. Device of claim 8 in which the said resistivity is at least $10^{12}$ ohm-centimeters.

10. Device of claim 1 in which the concentration of the centers of said solute material is such that the average spacing of the said solute material is at least comparable to the mean free path for the said charge carrier.

11. Device of claim 1 in which the said host consists essentially of lithium niobate and in which the said solute is $Fe^{2+}$.

12. Device of claim 1 including means for making radiation incident on the said body, said means providing for radiation of sufficient intensity to produce a steady state photovoltage, said device also being provided with means for detecting said steady state photovoltage of corresponding steady state photocurrent.

* * * * *

UNITED STATES PATENT AND TRADEMARK OFFICE
CERTIFICATE OF CORRECTION

PATENT NO. : 3,975,632
DATED : August 17, 1976
INVENTOR(S) : Alastair M. Glass and Dietrich von der Linde It is certified that error appears in the above-identified patent and that said Letters Patent are hereby corrected as shown below:

Column 4, line 20, "states" should be --stated--.

Column 5, line 19, after "primary" insert --current--.

Column 5, line 24, "comtem" should be --contem--.

Column 5, line 35, after "of" insert --~--.

Column 5, line 37, "0.0225" should be --0.025--.

Signed and Sealed this

Nineteenth Day of April 1977

[SEAL]

Attest:

RUTH C. MASON
Attesting Officer

C. MARSHALL DANN
Commissioner of Patents and Trademarks